US012796161B2

(12) United States Patent
Tao et al.

(10) Patent No.: US 12,796,161 B2
(45) Date of Patent: Nov. 10, 2026

(54) PHOTOVOLTAIC ASSEMBLY AND MANUFACTURING METHOD THEREOF

(71) Applicants: JINKO SOLAR CO., LTD., Jiangxi (CN); ZHEJIANG JINKO SOLAR CO., LTD., Haining (CN)

(72) Inventors: Wusong Tao, Shangrao (CN); Yunfei Xie, Shangrao (CN); Shuang Wang, Shangrao (CN); Changchun Peng, Shangrao (CN); Shun Chen, Shangrao (CN)

(73) Assignees: JINKO SOLAR CO., LTD., Jiangxi (CN); ZHEJIANG JINKO SOLAR CO., LTD., Haining (CN)

( * ) Notice: Subject to any disclaimer, the term of this patent is extended or adjusted under 35 U.S.C. 154(b) by 0 days.

(21) Appl. No.: 19/003,391

(22) Filed: Dec. 27, 2024

(65) Prior Publication Data

US 2026/0123100 A1 Apr. 30, 2026

(30) Foreign Application Priority Data

May 6, 2024 (CN) ......................... 202410546919.4

(51) Int. Cl.
*H10F 77/50* (2025.01)

(52) U.S. Cl.
CPC .................................... *H10F 77/50* (2025.01)

(58) Field of Classification Search
None
See application file for complete search history.

(56) References Cited

U.S. PATENT DOCUMENTS

2018/0261707 A1* 9/2018 Zhou ..................... H10F 77/937

FOREIGN PATENT DOCUMENTS

| | | | | |
|---|---|---|---|---|
| CN | 206040669 U | 3/2017 | | |
| CN | 109041582 A | * 12/2018 | ............. | H02S 40/36 |
| CN | 109166938 A | 1/2019 | | |
| CN | 115692526 A | * 2/2023 | | |
| CN | 116613229 A | 8/2023 | | |
| CN | 117525189 A | 2/2024 | | |
| TW | 200921925 A | 5/2009 | | |
| WO | 2020133284 A1 | 7/2020 | | |

* cited by examiner

*Primary Examiner* — Dustin Q Dam
(74) *Attorney, Agent, or Firm* — Ballard Spahr LLP

(57) ABSTRACT

A photovoltaic assembly includes a first cover plate, a first adhesive film, a solar cell layer, a second adhesive film, and a second cover plate that are stacked in sequence. The first cover plate is provided on a light-facing surface of the photovoltaic assembly. A first pad strip is provided between the first cover plate and the first adhesive film. The first pad strip covers a long edge region, a short edge region, and a middle strip region of the first adhesive film. A second pad strip is provided between the solar cell layer and the second adhesive film. The second pad strip covers a short edge region of the second adhesive film.

18 Claims, 2 Drawing Sheets

PHOTOVOLTAIC ASSEMBLY AND MANUFACTURING METHOD THEREOF

CROSS-REFERENCE TO RELATED APPLICATIONS

The present application claims priority to Chinese Patent Application No. 2024105469194, filed with the Chinese Patent Office on May 6, 2024, and titled "PHOTOVOLTAIC ASSEMBLY AND MANUFACTURING METHOD THEREOF", the entire content of which is incorporated herein in its entity.

TECHNICAL FIELD

The present disclosure relates to the field of photovoltaic technologies, and in particular, to a photovoltaic assembly and a manufacturing process thereof.

BACKGROUND

Photovoltaic assembly generally includes a first cover plate, a first adhesive film, a solar cell layer, a second adhesive film, and a second cover plate that are stacked in sequence. The first cover plate is provided on a light-facing surface of the photovoltaic assembly.

During packaging of the photovoltaic assembly with the above structure, due to a complex structure of four corners and a middle opening of the photovoltaic assembly, stress during lamination is unevenly distributed. During the lamination, the adhesive film cannot evenly and tightly wrap and fill the four corners and holes in the middle opening, leading to a higher risk of delamination or bubbles and a low lamination yield of the photovoltaic assembly.

SUMMARY

In view of this, the present disclosure provides a photovoltaic assembly and a manufacturing process thereof, in which a first pad strip thickens four corners and a middle opening of the photovoltaic assembly, and a second pad strip thickens a short edge region of the photovoltaic assembly, to alleviate the problem of bubbles or delamination at four corners during lamination.

The present disclosure provides a photovoltaic assembly, including a first cover plate, a first adhesive film, a solar cell layer, a second adhesive film, and a second cover plate that are stacked in sequence, and the first cover plate is provided on a light-facing surface of the photovoltaic assembly;

a first pad strip is provided between the first cover plate and the first adhesive film, the first pad strip covers a long edge region, a short edge region, and a middle strip region of the first adhesive film; and a second pad strip is provided between the solar cell layer and the second adhesive film, the second pad strip covering a short edge region of the second adhesive film.

In some embodiments, the first pad strip includes a long pad strip, a short pad strip, and a middle pad strip; along a direction from the first cover plate of the photovoltaic assembly to the second cover plate, the long pad strip, the short pad strip, and the middle pad strip are stacked, and the long pad strip is located below the short pad strip and the middle pad strip.

In some embodiments, a length of the long pad strip is equal to a length of the first adhesive film, and lengths of the short pad strip and the middle pad strip are equal to a width of the first adhesive film; and the long pad strip and the short pad strip overlap at a corner of the first adhesive film, and the long pad strip and the middle pad strip overlap at two ends of the middle strip region of the first adhesive film.

In some embodiments, distances from one side of the long pad strip, one side of the short pad strip, and two ends of the middle pad strip to an edge of the first adhesive film range from 0 to 2 mm.

In some embodiments, a width of the first pad strip ranges from 30 mm to 60 mm, and/or a thickness of the first pad strip ranges from 0.4 mm to 0.6 mm, and/or a gram weight of the first pad strip ranges from 250 g/m$^2$ to 380 g/m$^2$.

In some embodiments, a gram weight of the first adhesive film ranges from 280 g/m$^2$ to 360 g/m$^2$.

In some embodiments, a material of the first adhesive film includes at least one of a polyolefin elastomer (POE) adhesive film, an EP adhesive film, and an EPE adhesive film.

In some embodiments, a width of the second pad strip ranges from 30 mm to 60 mm, and/or a thickness of the second pad strip ranges from 0.4 mm to 0.6 mm, and/or a gram weight of the second pad strip ranges from 250 g/m$^2$ to 380 g/m$^2$.

In some embodiments, a gram weight of the second adhesive film ranges from 300 g/m$^2$ to 380 g/m$^2$. In some embodiments, the second adhesive film is an ethylene vinyl acetate (EVA) adhesive film.

In a second aspect, the present disclosure provides a method for manufacturing the aforementioned photovoltaic assembly, and the method includes the following steps of:

stacking the first cover plate, the first pad strip, the first adhesive film, the solar cell layer, the second pad strip, the second adhesive film, and the second cover plate in sequence; wherein the first pad strip covers the long edge region, the short edge region, and the middle strip region of the first adhesive film, the second pad strip covers the short edge region of the second adhesive film, and along a direction from the first cover plate of the photovoltaic assembly to the second cover plate, the long pad strip, the short pad strip, and the middle pad strip are stacked, and the long pad strip is located below the short pad strip and the middle pad strip, and the long pad strip is located below the short pad strip and the middle pad strip; and melting, under a high temperature and high pressure condition, the first pad strip and the first adhesive film to make the first cover plate, the first pad strip, the first adhesive film, and the solar cell layer fit, and melting the second pad strip and the second adhesive film to make the second cover plate, the second adhesive film, the second pad strip, and the solar cell layer fit, to obtain a laminated structure, the photovoltaic assembly including the laminated structure.

By use of the above solutions, the present disclosure achieves at least the following beneficial effects.

According to the photovoltaic assembly provided in the present disclosure, the first pad strip is provided between the first cover plate and the first adhesive film, and the first pad strip covers the long edge region, the short edge region, and the middle strip region of the first adhesive film, that is, the first pad strip has a rectangular structure, so that the first pad strip can thicken the four corners and the middle opening of the photovoltaic assembly. At the same time, the second pad strip is provided between the solar cell layer and the short edge region of the second adhesive film, so that the second pad strip can further thicken the short edge region of the photovoltaic assembly. During lamination, through the cooperation between the first pad strip and the second pad strip with fluidity and hot-melt properties, tiny gaps between the first adhesive film and the first cover plate and between the solar cell layer and the second adhesive film can be filled, so that the first adhesive film and the second adhesive film can completely wrap the solar cell layer, and the first adhesive film and the first cover plate as well as the second adhesive film and the solar cell layer closely fit, which effectively alleviates the problem of bubbles or delamination at the four corners and the middle opening of the photovoltaic assembly during the lamination.

REFERENCE SIGNS

Figure 1:
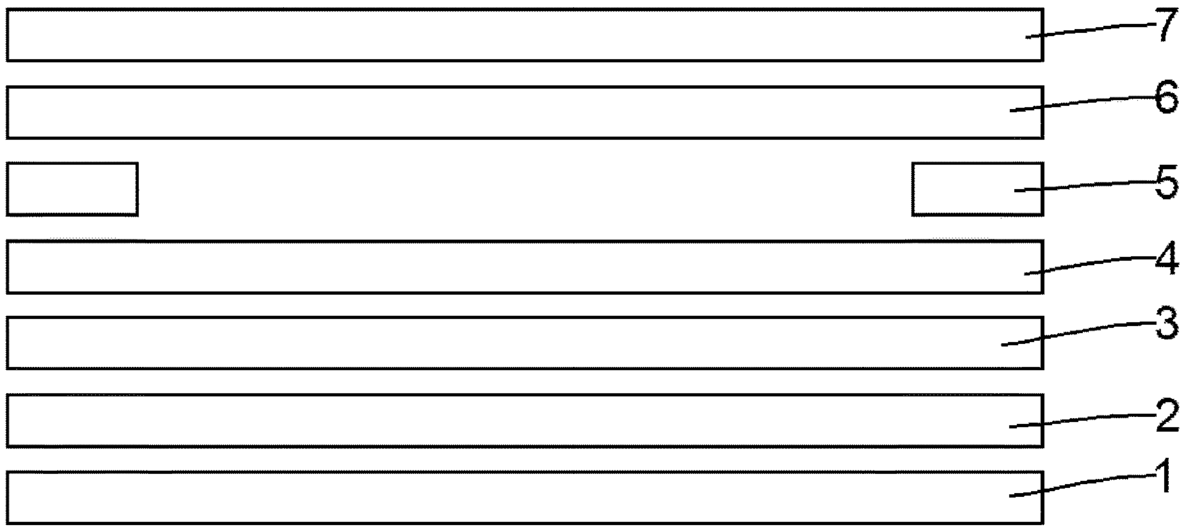
FIG. 1 is a schematic structural view of a photovoltaic assembly according to the present disclosure.

1: first cover plate; 2: first pad strip; 21: long pad strip; 22: short pad strip; 23: middle pad strip; 3: first adhesive film; 4: solar cell layer; 5: second pad strip; 6: second adhesive film; 7: second cover plate.

DETAILED DESCRIPTION

In order to better understand the technical solution of the present disclosure, the embodiments of the present disclosure will be described in detail below with reference to the accompanying drawings. It should be clear that the described embodiments are only some of rather than all of the embodiments of the present disclosure. Based on the embodiments in the present disclosure, all other embodiments obtained by those of ordinary skill in the art without making creative efforts fall within the protection scope of the present disclosure.

The terms used in the embodiments of the present disclosure are only for the purpose of describing specific embodiments and are not intended to limit the present disclosure. As used in the embodiments of the present disclosure and the appended claims, the singular forms of "a/an", "one", and "the" are also intended to include plural forms, unless otherwise clearly specified in the context.

It should be understood that the term "and/or" used herein describes an association relationship between associated objects and represents that three relationships may exist. For example, A and/or B may represent the following three cases: only A exists, both A and B exist, and only B exists. In addition, the character "/" herein generally indicates an "or" relationship between the associated objects.

It is to be noted that directional terms such as "upper", "lower", "left" and "right" described in the embodiments of the present disclosure are described from the perspectives shown in the drawings and should not be understood as limiting the embodiments of the present disclosure. In addition, in the context, it should be further understood that when one element is referred to as being connected "above" or "below" another element, the element can be directly connected "above" or "below" the another element, or indirectly connected "above" or "below" the another element through an intermediate element.

In some embodiments, composition of a photovoltaic assembly specifically includes a laminated structure and a frame. The laminated structure includes a first cover plate 1, a first adhesive film 3, a solar cell layer 4, a second adhesive film 6, and a second cover plate 7. The first cover plate 1 is provided on a light-facing surface of the photovoltaic assembly. The solar cell layer 4 includes a plurality of solar cell strings connected in parallel. The solar cell string includes a plurality of solar cells connected in series. The solar cell is a whole solar cell or a slice that is one-Nth of the whole solar cell. The type of the solar cell may be selected according to an actual requirement, which is not limited herein.

As an optional embodiment of the present disclosure, the type of the solar cell used in the present disclosure is a heterojunction with intrinsic thin-layer (HIT) solar cell. The HIT solar cell has a symmetrical double-sided solar cell structure, in which N-type crystalline silicon is in the middle, intrinsic amorphous silicon films and P-type amorphous silicon films are deposited on a front surface in sequence, to form a P-N junction, and intrinsic amorphous silicon films and N-type amorphous silicon films are deposited on a back surface in sequence, to form a back surface field. The HIT solar cell benefits from a dual passivation effect of an N-type silicon substrate and amorphous silicon on surface defects of a base, and has an advantage of high efficiency.

As an optional embodiment of the present disclosure, the type of the solar cell used in the present disclosure is a back contact (BC) solar cell. The BC solar cell means that bipolar metal grid lines (including bipolar busbars and bipolar fingers) and a PN junction on the solar cell are both located on a back surface of the solar cell and the bipolar metal grid lines are distributed at alternating intervals. The BC solar cell with the structure can reduce optical loss and have a higher short-circuit current Jsc because a front surface (a light conversion surface) of the solar cell is not blocked by structures such as the bipolar metal grid lines. At the same time, the back surface of the solar cell can allow wider bipolar metal grid lines to reduce series resistance Rs of the solar cell, thereby increasing a fill factor (FF). Moreover, according to open-circuit voltage gain caused by the front surface field and the good passivation effect of the solar cell, output power of the BC solar cell is increased, and the BC solar cell has high conversion efficiency.

As an optional embodiment of the present disclosure, the type of the solar cell used in the present disclosure is a passivated emitter rear cell (PERC). The PERC uses a passivation film to passivate a back surface of the solar cell, which replaces an all-aluminum back field, and enhances internal back reflection of light on a silicon base, thereby reduce a recombination rate on the back surface of the solar cell.

As an optional embodiment of the present disclosure, the type of the solar cell used in the present disclosure is a tunnel oxide passivated contact (TOPCON) solar cell. The TOPCON solar cell is a new high-efficiency solar photovoltaic cell, whose structure mainly includes an N-type monocrystalline silicon substrate, a tunnel dielectric layer formed by ultra-thin silicon oxide ($SiO_x$) or silicon nitride ($SiN_x$) deposited on the N-type monocrystalline silicon substrate, and a doped polysilicon layer covering the tunnel dielectric layer. A passivation effect of the tunnel dielectric layer allows electrons to reach the doped polysilicon layer or the N-type monocrystalline silicon substrate in contact with the tunnel dielectric layer through a tunnel effect, and simultaneously blocks holes from passing through and reduces recombinations of electrons and holes at an interface, thereby forming selective transport of carriers.

As an optional embodiment of the present disclosure, the type of the solar cell used in the present disclosure is a perovskite solar cell (PSC). The PSC uses a semiconductor material with an $ABX_3$ structure to capture sunlight and convert the sunlight into electrical energy, where A is a bulk cation, B is a transition metal ion, and X is a halogen anion.

As an optional embodiment of the present disclosure, adjacent solar cells in the present disclosure are connected in series through a conductive connecting element (such as a soldering wire or a solder strip) or conductive glue. That is, one end of the conductive connector is soldered to a back electrode of one solar cell, and the other end of the conductive connector is soldered to a front electrode of the other solar cell.

The type of the solar cell may be selected according to an actual requirement, which is not limited herein.

As an optional embodiment of the present disclosure, adjacent solar cells may form a photovoltaic assembly string by using a high-density assembly technology, that is, a shingling technology, a stitch welding technology, or a splicing technology, which greatly reduces or eliminates a gap between the solar cells.

In the shingling technology, a whole solar cell is cut into a plurality of solar cell strips by using a laser slicing technology, and the solar cell strips are flexibly connected by conductive glue. This connection manner optimizes the structure of the photovoltaic assembly string, achieves zero spacing between the solar cells, makes full use of a limited area of the photovoltaic assembly, and can place more solar cells than other types of assemblies in the same layout, thereby effectively increasing a light-receiving area of the assembly.

In the stitch welding technology, adjacent half-cut solar cells are welded by micro-spacing 'overlap' by means of a special round wire solder strip. This connection manner greatly reduces a distance between the solar cells during traditional welding and achieves high energy density. The round wire solder strip has a narrower cross-section than an ordinary flat solder strip, which reduces light shielding of the solar cell by the solder strip. In addition, a round side face of the solder strip also enhances reflection of incident light and a light secondary refractive index of front glass, and the introduction of the circular solder strip effectively solves inherent contradiction between busbar shielding and increased current collection capabilities, improves light absorption and utilization of the solar cell, and increases power of the assembly.

In the splicing technology, a triangular solder strip is used on the front surface of the solar cell and a super-flexible flat solder strip is used on the back surface. Adjacent half-cut solar cells are welded together at a micro-spacing through a double solder strip technology, achieving high energy density. The triangular solder strip used in the splicing technology is three-dimensionally soldered on the front surface of the solar cell, a nearly 45° side angle has a further improvement in a capability to reflect incident light compared to the circular solder strip, which can make full use of reflection to increase a capability of the solar cell to absorb light and increase the power of the assembly.

In this case, the solar cell layer 4 obtained after connection of the solar cells may be laminated with the first cover plate 1, the first adhesive film 3, the second adhesive film 6, and the second cover plate 7 at a certain temperature. The first cover plate 1, the first adhesive film 3, the solar cell layer 4, the second adhesive film 6, and the second cover plate 7 are stacked in sequence and heated to a certain temperature during the lamination. The first adhesive film 3 is melted and then bonded to the solar cell layer 4 and the first cover plate 1 respectively, and the second adhesive film 6 is melted and then bonded to the solar cell layer 4 and the second cover plate 7 respectively.

However, during packaging of the photovoltaic assembly with the above structure, due to a complex structure of four corners and a middle opening of the photovoltaic assembly, stress during lamination is unevenly distributed. During the lamination, the adhesive film cannot evenly and tightly wrap and fill the four corners and holes in the middle opening, leading to a higher risk of delamination or bubbles and a low lamination yield of the photovoltaic assembly.

Figure 2:
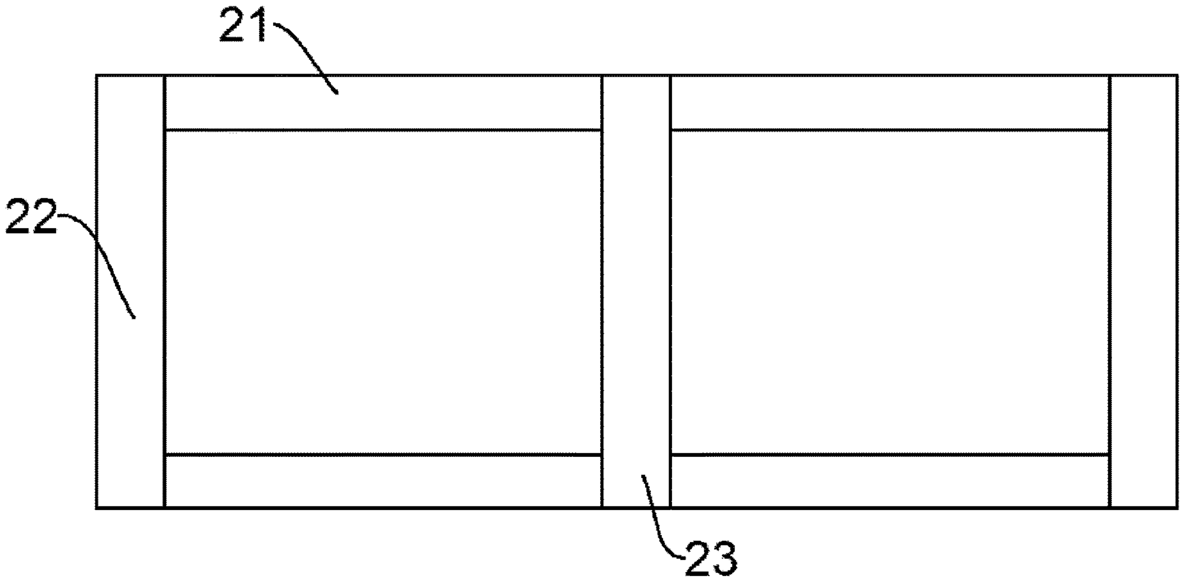
FIG. 2 is a schematic structural view of a first pad strip of the photovoltaic assembly according to the present disclosure.

In view of this, the present disclosure provides a photovoltaic assembly. Referring to FIG. 1 and FIG. 2, the photovoltaic assembly includes a first cover plate 1, a first adhesive film 3, a solar cell layer 4, a second adhesive film 6, and a second cover plate 7 that are stacked in sequence, and the first cover plate 1 is provided on a light-facing surface of the photovoltaic assembly.

A first pad strip 2 is provided between the first cover plate 1 and the first adhesive film 3. The first pad strip 2 covers a long edge region, a short edge region, and a middle strip region of the first adhesive film 3.

A second pad strip 5 is provided between the solar cell layer 4 and the second adhesive film 6. The second pad strip 5 covers a short edge region of the second adhesive film 6.

In the above solution, according to the photovoltaic assembly provided in the present disclosure, the first pad strip 2 is provided between the first cover plate 1 and the first adhesive film 3, and the first pad strip 2 covers the long edge region, the short edge region, and the middle strip region of the first adhesive film 3, that is, the first pad strip 2 has a rectangular structure, so that the first pad strip 2 can thicken the four corners and the middle opening of the photovoltaic assembly. At the same time, the second pad strip 5 is provided between the solar cell layer 4 and the short edge region of the second adhesive film 6, so that the second pad strip 5 can further thicken the short edge region of the photovoltaic assembly. During lamination, through the cooperation between the first pad strip 2 and the second pad strip 5 with fluidity and hot-melt properties, tiny gaps between the first adhesive film 3 and the first cover plate 1 and between the solar cell layer 4 and the second adhesive film 6 can be filled, so that the first adhesive film 3 and the second adhesive film 6 can completely wrap the solar cell layer 4, and the first adhesive film 3 and the first cover plate 1 as well as the second adhesive film 6 and the solar cell layer 4 closely fit, which effectively alleviates the problem of bubbles or delamination at the four corners and the middle opening of the photovoltaic assembly during the lamination.

In some embodiments, the first pad strip 2 includes a long pad strip 21, a short pad strip 22, and a middle pad strip 23. Along a direction from the first cover plate 1 of the photovoltaic assembly toward the second cover plate 7, the long pad strip 21, the short pad strip 22, and the middle pad strip 23 are stacked, and the long pad strip 21 is located below the short pad strip 22 and the middle pad strip 23, so that the long pad strip 21 and the short pad strip 22 overlap at a corner of the first adhesive film 3, and the long pad strip 21 and the middle pad strip 23 overlap at two ends of the middle strip region of the first adhesive film 3.

In the present disclosure, two long pad strips 21, two short pad strips 22, and one middle pad strip 23 are provided. A length of the long pad strip 21 is equal to a length of the first adhesive film 3, and lengths of the short pad strip 22 and the middle pad strip 23 are equal to a width of the first adhesive film 3, so that the first pad strip 2 has a rectangular structure.

As an optional embodiment of the present disclosure, the long pad strip 21, the short pad strip 22, and the middle pad strip 23 may alternatively be provided as an integrated structure. That is, thicknesses of upper, middle, and lower horizontal sides of the rectangular structure are greater than thicknesses of two left and right vertical sides. In this case, when the first pad strip 2 is provided between the first cover plate 1 and the first adhesive film 3, the four corners and the middle opening of the photovoltaic assembly can still be thickened. Alternatively, the long pad strip 21 and the short pad strip 22 have an integrated structure, or the long pad strip 21 and the middle pad strip 23 have an integrated structure. A manner of forming the first pad strip 2 may be selected according to an actual requirement, as long as the four corners and the middle opening of the photovoltaic assembly can be thickened, which is not limited herein.

In some embodiments, the first pad strip 2 is laid between the first adhesive film 3 and the first cover plate 1. Distances from one side of the long pad strip 21 of the first pad strip 2, one side of the short pad strip 22, and two ends of the middle pad strip 23 to an edge of the first adhesive film 3 range from 0 to 2 mm. Optionally, the distances from one side of the long pad strip 21 of the first pad strip 2, one side of the short pad strip 22, and two ends of the middle pad strip 23 to the edge of the first adhesive film 3 may specifically be 0, 0.2 mm, 0.4 mm, 0.6 mm, 0.8 mm, 1 mm, 1.2 mm, 1.4 mm, 1.6 mm, 1.8 mm, 2 mm, or other values within the range, which may be selected according to an actual requirement and is not limited herein. It should be understood that the first pad strip 2 has fluidity and hot-melt properties during the lamination. If the distances from one side of the long pad strip 21 of the first pad strip 2, one side of the short pad strip 22, and two ends of the middle pad strip 23 to the edge of the first adhesive film 3 are excessively large, a gap may be left between the first adhesive film 3 and the first cover plate 1 during the lamination, and bubbles may be formed during the lamination. As a result, edges where the two are connected cannot fit closes, and during long-term use, moisture and oxygen can easily penetrate, which accelerates aging of internal materials of the photovoltaic assembly, affects long-term stability of the photovoltaic assembly, and reduces efficiency and service life of the solar cell. Preferably, the distances from one side of the long pad strip 21 of the first pad strip 2, one side of the short pad strip 22, and two ends of the middle pad strip 23 to the edge of the first adhesive film 3 range from 0 mm to 1 mm.

In some embodiments, a width of the first pad strip 2 ranges from 30 mm to 60 mm, and a thickness of the first pad strip 2 ranges from 0.4 mm to 0.6 mm. Optionally, the width of the first pad strip 2 may specifically be 30 mm, 35 mm, 40 mm, 45 mm, 50 mm, 55 mm, 60 mm, or the like, and the thickness of the first pad strip 2 may specifically be 0.4 mm, 0.45 mm, 0.5 mm, 0.55 mm, 0.6 mm, or other values within the range, which may be selected according to an actual requirement and is not limited herein. It may be understood that the first pad strip 2 is used to fill the gap between the first adhesive film 3 and the first cover plate 1. If the width of the first pad strip 2 is excessively small or the thickness is excessively thin, that is, an excessively small amount of the first pad strip 2 is used, the gap between the first adhesive film 3 and the first cover plate 1 cannot be effectively filled, and the problem of bubbles or delamination of the photovoltaic assembly during the lamination cannot be effectively solved. If the width of the first pad strip 2 is excessively large and the thickness is excessively high, material costs are increased, and heat distribution during lamination is uneven. The first pad strip 2 does not melt sufficiently, affecting discharge of gas between the first adhesive film 3 and the first cover plate 1, thereby increasing the risk of bubbles and delamination.

A gram weight of the first pad strip 2 ranges from 250 g/m$^2$ to 380 g/m$^2$. Optionally, the gram weight of the first pad strip 2 may specifically be 250 g/m$^2$, 270 g/m$^2$, 290 g/m$^2$, 310 g/m$^2$, 330 g/m$^2$, 350 g/m$^2$, 370 g/m$^2$, or 380 g/m$^2$, or other values within the range, which may be selected according to an actual requirement and is not limited herein. It should be understood that if the gram weight of the first pad strip 2 may affect a weight of the photovoltaic assembly finally manufactured. If the gram weight of the first pad strip 2 is excessively low, delamination may occur at the edge of the assembly, the mechanical properties may be reduced, and an effect of mechanical support cannot be achieved, so that when the photovoltaic assembly is subjected to mechanical stress, tear and impact resistance of the laminated structure weaken, increasing a risk of failure of the photovoltaic assembly. If the gram weight of the first pad strip 2 is excessively high, the weight of the photovoltaic assembly manufactured may be increased, mounting difficulty may be increased, and there is a higher requirement for a support structure of the photovoltaic assembly.

In some embodiments, after the first pad strip 2 is used, the gap between the first adhesive film 3 and the first cover plate 1 may be filled, so as to remedy the problem of insufficient sealing caused by the low gram weight adhesive film. Then, the photovoltaic assembly in the present disclosure may use the low gram weight first adhesive film 3, which ensures a lamination yield of the photovoltaic assembly and also reduces the weight of the photovoltaic assembly. A gram weight of the first adhesive film 3 ranges from 280 g/m$^2$ to 360 g/m$^2$. Optionally, the gram weight of the first adhesive film 3 may specifically be 280 g/m$^2$, 290 g/m$^2$, 300 g/m$^2$, 310 g/m$^2$, 320 g/m$^2$, 330 g/m$^2$, 340 g/m$^2$, 350 g/m$^2$, or 360 g/m$^2$, or other values within the range, which may be selected according to an actual requirement and is not limited herein. It should be understood that if the gram weight of the first adhesive film 3 is within the above range, manufacturing costs of the photovoltaic assembly can be saved, an overall weight of the photovoltaic assembly can be reduced, and it is conducive to simplifying mounting, transportation, and maintenance processes of the photovoltaic assembly.

A material of the first adhesive film 3 used in the present disclosure includes at least one of a POE adhesive film, an EP adhesive film, and an EPE adhesive film, which may be selected according to an actual requirement and is not limited herein.

In some embodiments, a width of the second pad strip 5 ranges from 30 mm to 60 mm, and a thickness of the second pad strip 5 ranges from 0.4 mm to 0.6 mm. Optionally, the width of the second pad strip 5 may specifically be 30 mm, 35 mm, 40 mm, 45 mm, 50 mm, 55 mm, 60 mm, or the like, and the thickness of the second pad strip 5 may specifically be 0.4 mm, 0.45 mm, 0.50 mm, 0.55 mm, 0.6 mm, or other values within the range, which may be selected according to an actual requirement and is not limited herein. It should be understood that the second pad strip 5 is used to fill the gap between the second adhesive film 6 and the solar cell layer 4. If the width of the second pad strip 5 is excessively small or the thickness is excessively thin, that is, an excessively small amount of the second pad strip 5 is used, the gap between the second adhesive film 6 and the solar cell layer 4 cannot be effectively filled, and the problem of bubbles or delamination of the photovoltaic assembly during the lamination cannot be effectively solved. If the width of the second pad strip 5 is excessively large and the thickness is excessively high, material costs are increased, and heat distribution during lamination is uneven. The second pad strip 5 does not melt sufficiently, affecting discharge of gas between the second adhesive film 6 and the solar cell layer 4, thereby increasing the risk of bubbles and delamination.

A gram weight of the second pad strip 5 ranges from 250 $g/m^2$ to 380 $g/m^2$. Optionally, the gram weight of the second pad strip 5 may specifically be 250 $g/m^2$, 270 $g/m^2$, 290 $g/m^2$, 310 $g/m^2$, 320 $g/m^2$, 330 $g/m^2$, 340 $g/m^2$, 350 $g/m^2$, 370 $g/m^2$, or 380 $g/m^2$, or other values within the range, which may be selected according to an actual requirement and is not limited herein. It should be understood that the gram weight of the second pad strip 5 will affect a weight of the photovoltaic assembly finally manufactured. If the gram weight of the second pad strip 5 is excessively low, delamination may occur at the edge of the assembly, the mechanical properties may be reduced, and an effect of mechanical support cannot be achieved, so that when the photovoltaic assembly is subjected to mechanical stress, tear and impact resistance of the laminated structure weaken, increasing a risk of failure of the photovoltaic assembly. If the gram weight of the second pad strip 5 is excessively high, the weight of the photovoltaic assembly manufactured may be increased, mounting difficulty may be increased, and there is a higher requirement for a support structure of the photovoltaic assembly.

The first pad strip 2 and the second pad strip 5 used in the present disclosure may both be made of EVA materials.

The second adhesive film 6 used in the present disclosure may be an EVA adhesive film, a POE adhesive film, or a polyethylene terephthalate (PET) adhesive film, or may be a polyvinyl butyral (PVB) adhesive film, an EPE adhesive film (three-layer co-extruded sealing members of EVA and POE), or an EP adhesive film (two-layer co-extruded sealing members of EVA and POE), or may be other types of adhesive films, which may be selected according to an actual requirement and is not limited herein. Preferably, the second adhesive film 6 used in the present disclosure is an EVA adhesive film. The EVA adhesive film is non-adhesive at room temperature, has good flexibility, transparency, surface gloss, stable chemical properties, anti-aging, and good ozone resistance strength, is non-toxic, and undergoes melt bonding and cross-linking curing after a condition of hot pressing. The cured adhesive film has excellent light transmittance, bonding strength, thermal stability, air tightness, and aging resistance. When the solar cell layer 4 is packaged, light conversion performance of the photovoltaic assembly may not be affected.

A gram weight of the second adhesive film 6 ranges from 300 $g/m^2$ to 380 $g/m^2$. Optionally, the gram weight of the second adhesive film 6 may specifically be 300 $g/m^2$, 310 $g/m^2$, 320 $g/m^2$, 330 $g/m^2$, 340 $g/m^2$, 350 $g/m^2$, or 380 $g/m^2$, or other values within the range, which may be selected according to an actual requirement and is not limited herein. It should be understood that if the gram weight of the second adhesive film 6 is within the above range, manufacturing costs of the photovoltaic assembly can be saved, an overall weight of the photovoltaic assembly can be reduced, and it is conducive to simplifying mounting, transportation, and maintenance processes of the photovoltaic assembly.

In some embodiments, the first cover plate 1 is provided on a side of the first adhesive film 3 away from the solar cell, that is, the light-facing side. The first cover plate 1 is also referred to as a "photoelectric glass", which has good light transmission and high hardness. After covering the first adhesive film 3, it can adapt to a large temperature difference between day and night and a bad weather environment, thereby protecting the solar cell. The first cover plate 1 used in the present disclosure may be ultra-clear photovoltaic patterned glass or ultra-clear machined float glass, or other types of first cover plates 1, which may be selected according to an actual requirement and is not limited herein.

The second cover plate 7 is provided on a side of the second adhesive film 6 away from the solar cell. The second cover plate 7 also protects and supports the solar cell, and has good weather resistance, water resistance, corrosion resistance, and insulation, which can not only isolate the photovoltaic assembly from surrounding photovoltaic environments, but also effectively protect and support the solar cell, thereby improving resistance strength of the photovoltaic assembly. The second cover plate 7 used in the present disclosure may be glass, calendered glass, or ultra-white calendered glass.

In some embodiments, the present disclosure provides a method for manufacturing a photovoltaic assembly. The first cover plate 1, the first pad strip 2, the first adhesive film 3, the solar cell layer 4, the second pad strip 5, the second adhesive film 6, and the second cover plate 7 that are stacked are placed in a laminator. The first pad strip 2 covers the long edge region, the short edge region, and the middle strip region of the first adhesive film 3, the second pad strip 5 covers a short edge region of the second adhesive film 6. Along a direction from the first cover plate 1 of the photovoltaic assembly to the second cover plate 7, the long pad strip 21, the short pad strip 22, and the middle pad strip 23 are stacked, and the long pad strip 21 is located below the short pad strip 22 and the middle pad strip 23. Then, air inside the assembly is removed by vacuuming, and the first pad strip 2, the second pad strip 5, the first adhesive film 3, and the second adhesive film 6 are melted by heating (i.e., under a high temperature and high pressure condition) to bond the solar cell layer 4, the first cover plate 1, and the second cover plate 7 together, to obtain a laminated structure. In this process, through the cooperation between the first pad strip 2 and the second pad strip 5 with fluidity and hot-melt properties, tiny gaps between the first adhesive film 3 and the first cover plate 1 and between the solar cell layer 4 and the second adhesive film 6 can be filled, so that the first adhesive film 3 and the second adhesive film 6 can completely wrap the solar cell layer 4, and the first adhesive film 3 and the first cover plate 1 as well as the second adhesive film 6 and the solar cell layer 4 closely fit, which effectively alleviates the problem of bubbles or delamination at the four corners and the middle opening of the photovoltaic assembly during the lamination.

After the laminated structure is bonded, the photovoltaic assembly can be assembled through the frame, and finally the photovoltaic assembly is fixed to a bracket by a pressing block for use. The bracket is a special frame designed and mounted for supporting, fixing, and rotating the photovoltaic assembly. According to structures, brackets may be classified into fixed brackets and tracking brackets. The fixed bracket has a fixed direction and a low manufacturing cost. The tracking bracket can rotate the photovoltaic assembly angularly according to light intensity, which can reduce an angle between the assembly and the direct sunlight, obtain more solar radiation, and effectively improve the power generation efficiency, but the manufacturing cost is high. According to materials, brackets may be classified into aluminum alloy brackets, carbon steel brackets, stainless steel brackets, and the like. The structure and the material of the bracket may be selected according to an actual requirement, and are not limited herein. In actual use, the photovoltaic bracket may the fix photovoltaic assembly in a certain orientation, arrangement manner, and spacing according to topography, climate, and solar resource conditions. It should be understood that the photovoltaic assembly can better receive the sunlight after fixed by the bracket.

As an optional embodiment of the present disclosure, the photovoltaic assembly includes a first cover plate 1, a first adhesive film 3, a solar cell layer 4, a second adhesive film 6, and a second cover plate 7 that are stacked in sequence. The first cover plate 1 is provided on a light-facing surface of the photovoltaic assembly. A first pad strip 2 is provided between the first cover plate 1 and the first adhesive film 3. The first pad strip 2 covers a long edge region, a short edge region, and a middle strip region of the first adhesive film 3. That is, in the above embodiments, the photovoltaic assembly is not provided the second pad strip 5, and a tiny gap between the first adhesive film 3 and the first cover plate 1 can be filled by further increasing the thickness of the first pad strip 2, so that the first adhesive film 3 can completely wrap the solar cell layer 4, and the first adhesive film 3 and the first cover plate 1 closely fit, which effectively alleviates the problem of bubbles or delamination at the four corners and the middle opening of the photovoltaic assembly during the lamination.

The embodiments in the present disclosure are described below with reference to specific embodiments.

Embodiment 1

(1) Ultra-clear photovoltaic patterned glass, a first pad strip, a POE adhesive film (a first adhesive film), a solar cell layer, a second pad strip, an EVA adhesive film (a second adhesive film), and rolled glass were stacked in sequence. The first pad strip had a width of 45 mm, a thickness of 0.5 mm, and a gram weight of 320 g/m$^2$, and the first pad strip included a long pad strip, a short pad strip, and a middle pad strip. The second pad strip had a width of 45 mm and a thickness of 0.5 mm. The first pad strip and the second pad strip were made of EVA materials.

(2) Under a high temperature and high pressure condition, the first pad strip and the POE adhesive film (the first adhesive film) were melted, so that the ultra-clear photovoltaic patterned glass, the first pad strip, the POE adhesive film (the first adhesive film), and the solar cell layer were attached. The second pad strip and the EVA adhesive film (the second adhesive film) were melted, so that the rolled glass, the EVA adhesive film (the second adhesive film), the second pad strip, and the solar cell layer were attached, to obtain a laminated structure.

(3) The laminated structure was assembled through a frame to obtain a photovoltaic assembly.

Embodiment 2

(1) Ultra-clear photovoltaic patterned glass, a first pad strip, a POE adhesive film (a first adhesive film), a solar cell layer, a second pad strip, an EVA adhesive film (a second adhesive film), and rolled glass were stacked in sequence. The first pad strip had a width of 30 mm, a thickness of 0.4 mm, and a gram weight of 250 g/m$^2$, and the first pad strip included a long pad strip, a short pad strip, and a middle pad strip. The second pad strip had a width of 45 mm and a thickness of 0.5 mm. The first pad strip and the second pad strip were made of EVA materials.

(2) Under a high temperature and high pressure condition, the first pad strip and the POE adhesive film (the first adhesive film) were melted, so that the ultra-clear photovoltaic patterned glass, the first pad strip, the POE adhesive film (the first adhesive film), and the solar cell layer were attached, and the second pad strip and the EVA adhesive film (the second adhesive film) were melted, so that the rolled glass, the EVA adhesive film (the second adhesive film), the second pad strip, and the solar cell layer were attached, to obtain a laminated structure.

(3) The laminated structure was assembled through a frame to obtain a photovoltaic assembly.

Embodiment 3

(1) Ultra-clear photovoltaic patterned glass, a first pad strip, a POE adhesive film (a first adhesive film), a solar cell layer, a second pad strip, an EVA adhesive film (a second adhesive film), and rolled glass were stacked in sequence. The first pad strip had a width of 60 mm, a thickness of 0.6 mm, and a gram weight of 380 g/m$^2$, and the first pad strip included a long pad strip, a short pad strip, and a middle pad strip. The second pad strip had a width of 45 mm and a thickness of 0.5 mm. The first pad strip and the second pad strip were made of EVA materials.

(2) Under a high temperature and high pressure condition, the first pad strip and the POE adhesive film (the first adhesive film) were melted, so that the ultra-clear photovoltaic patterned glass, the first pad strip, the POE adhesive film (the first adhesive film), and the solar cell layer were attached, and the second pad strip and the EVA adhesive film (the second adhesive film) were melted, so that the rolled glass, the EVA adhesive film (the second adhesive film), the second pad strip, and the solar cell layer were attached, to obtain a laminated structure.

(3) The laminated structure was assembled through a frame to obtain a photovoltaic assembly.

Embodiment 4

(1) Ultra-clear photovoltaic patterned glass, a first pad strip, a POE adhesive film (a first adhesive film), a solar cell layer, a second pad strip, an EVA adhesive film (a second adhesive film), and rolled glass were stacked in sequence. The first pad strip had a width of 20 mm, a thickness of 0.35 mm, and a gram weight of 220 g/m$^2$, and the first pad strip included a long pad strip, a short pad strip, and a middle pad strip. The second pad strip had a width of 45 mm and a thickness of 0.5 mm. The first pad strip and the second pad strip were made of EVA materials.

(2) Under a high temperature and high pressure condition, the first pad strip and the POE adhesive film (the first adhesive film) were melted so that the ultra-clear photovoltaic patterned glass, the first pad strip, the POE adhesive film (the first adhesive film), and the solar cell layer were attached, and the second pad strip and the EVA adhesive film (the second adhesive film) were melted so that the rolled glass, the EVA adhesive film (the second adhesive film), the second pad strip, and the solar cell layer were attached, to obtain a laminated structure.

(3) The laminated structure was assembled through a frame to obtain a photovoltaic assembly.

Comparative Example 1

Different from Embodiment 1, the first pad strip included only a long pad strip.

Comparative Example 2

Different from Embodiment 1, the first pad strip included only a short pad strip.

Comparative Example 3

Different from Embodiment 1, the first pad strip included only a middle pad strip.

Comparative Example 4

Different from Embodiment 1, the first pad strip was not provided between the ultra-clear photovoltaic patterned glass and the POE adhesive film (the first adhesive film).

Test: the first pad strip and the second pad strip used in Embodiments 1 to 4 and Comparative Examples 1 to 4 were all made of EVA materials. Embodiments 1 to 4 and Comparative Examples 1 to 4 were tested 100 times to observe the number of defects such as bubbles or delamination in the laminated structure.

Test Results:

| | Risk of delamination/ bubbles (%) |
|---|---|
| Embodiment 1 | 0 |
| Embodiment 2 | 0 |
| Embodiment 3 | 0 |
| Embodiment 4 | 5 |
| Comparative Example 1 | 2 |
| Comparative Example 2 | 3 |
| Comparative Example 3 | 13 |
| Comparative Example 4 | 24 |

Analysis of Test Results:

As can be seen from the test results in Embodiment 1 to Embodiment 3, according to the photovoltaic assembly provided in the present disclosure, the first pad strip is provided between the first cover plate and the first adhesive film. At the same time, the second pad strip is provided between the solar cell layer and the short edge region of the second adhesive film. Moreover, by controlling specification parameters of the first pad string and the second pad string, during lamination, through the cooperation between the first pad strip and the second pad strip with fluidity and hot-melt properties, tiny gaps between the first adhesive film and the first cover plate and between the solar cell layer and the second adhesive film can be filled, so that the first adhesive film and the second adhesive film can completely wrap the solar cell layer, and the first adhesive film and the first cover plate as well as the second adhesive film and the solar cell layer closely fit, which effectively alleviates the problem of bubbles or delamination at the four corners and the middle opening of the photovoltaic assembly during the lamination.

As can be seen from the test structures in Embodiment 1 and Embodiment 4, in Embodiment 4, an excessively small amount of the first pad strip is used, which cannot effectively fill the gap between the first adhesive film and the first cover and cannot effectively solve the problem of bubbles or delamination of the photovoltaic assembly during the lamination.

As can be seen from the test results in Embodiment 1 and Comparative Examples 1 to 3, in Comparative Examples 1 to 3, only the first pad strip is provided, which cannot effectively fill gaps in parameters during the lamination and cannot effectively solve the problem of bubbles or delamination of the photovoltaic assembly during the lamination.

As can be seen from the test results in Embodiment 1 and Comparative Example 4, in Comparative Example 4, the first pad strip is not provided, and the photovoltaic assembly has a high probability of bubbles or delamination during the lamination.

The structure, features, and effects of the present disclosure have been described in detail with reference to the embodiments shown in the accompanying drawings. The above embodiments are only preferred embodiments of the present disclosure, but the implementation scope of the present disclosure is not limited to the accompanying drawings as shown. Any changes made according to the concept of the present disclosure, or equivalent embodiments that are modified to equivalent variations, should still fall within the protection scope of the present disclosure if they do not go beyond the spirit covered by the specification and the drawings.

What is claimed is:

1. A photovoltaic assembly, comprising:

a first cover plate, a first adhesive film, a solar cell layer, a second adhesive film, and a second cover plate that are stacked in sequence, wherein the first cover plate is provided on a light-facing surface of the photovoltaic assembly;

wherein a first pad strip is provided between the first cover plate and the first adhesive film, and the first pad strip covers a long edge region, a short edge region, and a middle strip region of the first adhesive film;

wherein a second pad strip is provided between the solar cell layer and the second adhesive film, and the second pad strip covers a short edge region of the second adhesive film;

wherein the first pad strip comprises a long pad strip, a short pad strip, and a middle pad strip; along a direction from the first cover plate of the photovoltaic assembly to the second cover plate, the long pad strip, the short pad strip, and the middle pad strip are stacked, and the long pad strip is located below the short pad strip and the middle pad strip;

wherein distances from one side of the long pad strip, one side of the short pad strip, and two ends of the middle pad strip to an edge of the first adhesive film range from 0.2 to 2 mm.

2. The photovoltaic assembly according to claim 1, wherein a length of the long pad strip is equal to a length of the first adhesive film, lengths of the short pad strip and the middle pad strip are equal to a width of the first adhesive film.

3. The photovoltaic assembly according to claim 1, wherein the long pad strip and the short pad strip overlap at a corner of the first adhesive film, and the long pad strip and the middle pad strip overlap at two ends of the middle strip region of the first adhesive film.

4. The photovoltaic assembly according to claim 1, wherein a width of the first pad strip ranges from 30 mm to 60 mm.

5. The photovoltaic assembly according to claim 1, wherein a thickness of the first pad strip ranges from 0.4 mm to 0.6 mm.

6. The photovoltaic assembly according to claim 1, wherein a gram weight of the first pad strip ranges from 250 $g/m^2$ to 380 $g/m^2$.

7. The photovoltaic assembly according to claim 1, wherein a gram weight of the first adhesive film ranges from 280 $g/m^2$ to 360 $g/m^2$.

8. The photovoltaic assembly according to claim 1, wherein a material of the first adhesive film comprises at least one of a polyolefin elastomer (POE) adhesive film, an EP adhesive film, or an EPE adhesive film.

9. The photovoltaic assembly according to claim 1, wherein a width of the second pad strip ranges from 30 mm to 60 mm.

10. The photovoltaic assembly according to claim 1, wherein a thickness of the second pad strip ranges from 0.4 mm to 0.6 mm.

11. The photovoltaic assembly according to claim 1, wherein a gram weight of the second pad strip ranges from 250 $g/m^2$ to 380 $g/m^2$.

12. The photovoltaic assembly according to claim 1, wherein a gram weight of the second adhesive film ranges from 300 $g/m^2$ to 380 $g/m^2$.

13. The photovoltaic assembly according to claim 1, wherein the second adhesive film is an ethylene vinyl acetate (EVA) adhesive film.

14. The photovoltaic assembly according to claim 1, wherein the second adhesive film is a POE adhesive film, a polyethylene terephthalate (PET) adhesive film, a polyvinyl butyral (PVB) adhesive film, an EPE adhesive film, or an EP adhesive film.

15. The photovoltaic assembly according to claim 1, wherein the first pad strip and the second pad strip are both made of EVA material.

16. The photovoltaic assembly according to claim 1, wherein the solar cell layer comprises a plurality of solar cell strings connected in parallel, and each solar cell string comprises a plurality of solar cells connected in series.

17. The photovoltaic assembly according to claim 16, wherein each of the plurality of solar cells is a heterojunction with intrinsic thin-layer (HIT) solar cell, a back contact (BC) solar cell, a passivated emitter rear cell, a tunnel oxide passivated contact (TOPCON) solar cell, or a perovskite solar cell (PSC).

18. A method for manufacturing the photovoltaic assembly according to claim 1, the method comprising:

stacking the first cover plate, the first pad strip, the first adhesive film, the solar cell layer, the second pad strip, the second adhesive film, and the second cover plate in sequence;

wherein the first pad strip covers the long edge region, the short edge region, and the middle strip region of the first adhesive film, the second pad strip covers the short edge region of the second adhesive film, and along a direction from the first cover plate of the photovoltaic assembly to the second cover plate, the long pad strip, the short pad strip, and the middle pad strip are stacked, and the long pad strip is located below the short pad strip and the middle pad strip; and melting the first pad strip and the first adhesive film to make the first cover plate, the first pad strip, the first adhesive film, and the solar cell layer fit, and melting the second pad strip and the second adhesive film to make the second cover plate, the second adhesive film, the second pad strip, and the solar cell layer fit, to obtain a laminated structure, the photovoltaic assembly comprising the laminated structure.

* * * * *